United States Patent [19]
Hsieh

[11] Patent Number: 5,648,774
[45] Date of Patent: Jul. 15, 1997

[54] VARIABLE LENGTH CODING WITH THREE-FIELD CODES

[75] Inventor: Hsun-Chang Hsieh, Hsinchu, Taiwan

[73] Assignee: Industrial Technology Research Institute, Chutung, Taiwan

[21] Appl. No.: 437,011

[22] Filed: May 8, 1995

[51] Int. Cl.$^6$ .................................................. H03M 7/40
[52] U.S. Cl. ........................................... 341/67; 341/65
[58] Field of Search .................................. 341/67, 65

[56] References Cited

U.S. PATENT DOCUMENTS

| | | | |
|---|---|---|---|
| 4,922,510 | 5/1990 | Bruzewitz | 375/122 |
| 4,985,700 | 1/1991 | Mikami | 341/59 |
| 5,006,930 | 4/1991 | Stroppiana et al. | 358/133 |
| 5,128,758 | 7/1992 | Azadegan et al. | 358/133 |
| 5,162,795 | 11/1992 | Shirota | 341/67 |
| 5,179,442 | 1/1993 | Azadegan et al. | 358/133 |
| 5,226,082 | 7/1993 | Kustka | 380/46 |
| 5,253,053 | 10/1993 | Chu et al. | 358/133 |

OTHER PUBLICATIONS

"An Entropy Coding System for Digital HDTV Applications", IEEE Transactions On Circuits And Systems For Video Technology, vol. 1, No. 1, Shaw–Min Lei, Member, IEEE, and Ming–Ting Sun, Senior Member, IEEE (1991).

*Primary Examiner*—Howard L. Williams
*Assistant Examiner*—Thuy-Trang N. Huynh
*Attorney, Agent, or Firm*—Meltzer, Lippe, Goldstein, et al.

[57] ABSTRACT

The present invention relates to variable length coding (VLC). Variable length coding is a widely-used method in data compression, especially, in the applications of video data communication and storage. Many international standards have adopted this technique in video data compression, for example, JPEG, MPEG, CCITT H.261 and so on. Various implementation methods have been proposed for variable length coding. Most of those methods implement the coding with two-field codes. That is, a code is represented by a code word and a code length. However, in this invention, a three-field representation is used for each code. In comparison with the two-field method, this method not only reduces the storage requirements of the code-book but also reduces the hardware or cost to implement a variable length encoder. Moreover, variable length coding can be implemented using both parallel VLC encoders and serial VLC encoders.

7 Claims, 5 Drawing Sheets

FIG. 1

| NO. | RUN | LEVEL | CODE | NO. | RUN | LEVEL | CODE |
|---|---|---|---|---|---|---|---|
| 1 | EOB | | 10 | 34 | 3 | 4 | 0000 0000 1001 1s |
| 2 | 0 | 1 | 1s (FIRST COEFFICIENT IN BLOCK) | 35 | 4 | 1 | 0011 0s |
| | | | | 35 | 4 | 2 | 0000 0011 11s |
| 3 | 0 | 1 | 11s (NOT FIRST COEFFICIENT IN BLOCK) | 36 | 4 | 3 | 0000 0001 0010 s |
| | | | | 37 | 5 | 1 | 0001 11s |
| 4 | 0 | 2 | 0100 s | 48 | 5 | 2 | 0000 0010 01s |
| 5 | 0 | 3 | 0010 1s | 49 | 6 | 1 | 0001 01s |
| 6 | 0 | 4 | 0000 110s | 40 | 6 | 2 | 0000 0001 1110 s |
| 7 | 0 | 5 | 0010 0110 s | 41 | 7 | 1 | 0001 00s |
| 8 | 0 | 6 | 0010 0001 s | 42 | 7 | 2 | 0000 0001 0101 s |
| 9 | 0 | 7 | 0000 0010 10s | 43 | 8 | 1 | 0000 111s |
| 10 | 0 | 8 | 0000 0001 1101 s | 44 | 8 | 2 | 0000 0001 0001 s |
| 11 | 0 | 9 | 0000 0001 1000 s | 45 | 9 | 1 | 0000 101s |
| 12 | 0 | 10 | 0000 0001 0011 s | 46 | 9 | 2 | 0000 0000 1000 1s |
| 13 | 0 | 11 | 0000 0001 0000 s | 47 | 10 | 1 | 0010 0111 s |
| 14 | 0 | 12 | 0000 0000 1101 0s | 58 | 10 | 2 | 0000 0000 1000 0s |
| 15 | 0 | 13 | 0000 0000 1100 1s | 59 | 11 | 1 | 0010 0011 s |
| 16 | 0 | 14 | 0000 0000 1100 0s | 50 | 12 | 1 | 0010 0010 s |
| 17 | 0 | 15 | 0000 0000 1011 1s | 51 | 13 | 1 | 0010 0000 s |
| 18 | 1 | 1 | 011s | 52 | 14 | 1 | 0000 0011 10s |
| 19 | 1 | 2 | 0001 10s | 53 | 15 | 1 | 0000 0011 01s |
| 20 | 1 | 3 | 0010 0101 s | 54 | 16 | 1 | 0000 0011 00s |
| 21 | 1 | 4 | 0000 0011 00s | 55 | 17 | 1 | 0000 0001 1111 s |
| 22 | 1 | 5 | 0000 0001 1011 s | 56 | 18 | 1 | 0000 0001 1010 s |
| 23 | 1 | 6 | 0000 0000 1011 0s | 57 | 19 | 1 | 0000 0001 1001 s |
| 24 | 1 | 7 | 0000 0000 1010 1s | 68 | 20 | 1 | 0000 0001 0111 s |
| 25 | 2 | 1 | 0101 s | 69 | 21 | 1 | 0000 0001 0110 s |
| 26 | 2 | 2 | 0000 100s | 60 | 22 | 1 | 0000 0000 1111 1s |
| 27 | 2 | 3 | 0000 0010 11s | 61 | 23 | 1 | 0000 0000 1111 0s |
| 28 | 2 | 4 | 0000 0001 0100 s | 62 | 24 | 1 | 0000 0000 1110 1s |
| 29 | 2 | 5 | 0000 0000 1010 0s | 63 | 25 | 1 | 0000 0000 1110 0s |
| 30 | 3 | 1 | 0011 1s | 64 | 26 | 1 | 0000 0000 1101 1s |
| 31 | 3 | 2 | 0010 0100 s | 65 | ESCAPE | | 0000 01 |
| 32 | 3 | 3 | 0000 0001 1100 s | | | | |

FIG. 2

| NO. | LENGTH | CODE | NO. | LEVEL | CODE |
|---|---|---|---|---|---|
| 1 | 2 | 10 | 34 | 14 | 0000 0000 1001 1s |
| 2 | 2 | 1s | 35 | 6 | 0011 0s |
|   |   |   | 35 | 11 | 0000 0011 11s |
| 3 | 3 | 11s | 36 | 13 | 0000 0001 0010 s |
|   |   |   | 37 | 7 | 0001 11s |
| 4 | 5 | 0100 s | 48 | 11 | 0000 0010 01s |
| 5 | 6 | 0010 1s | 49 | 7 | 0001 01s |
| 6 | 8 | 0000 1100 | 40 | 13 | 0000 0001 1110 s |
| 7 | 9 | 0010 0110 s | 41 | 7 | 0001 00s |
| 8 | 9 | 0010 0001 s | 42 | 13 | 0000 0001 0101 s |
| 9 | 11 | 0000 0010 10s | 43 | 8 | 0000 111s |
| 10 | 13 | 0000 0001 1101 s | 44 | 13 | 0000 0001 0001 s |
| 11 | 13 | 0000 0001 1000 s | 45 | 8 | 0000 101s |
| 12 | 13 | 0000 0001 0011 s | 46 | 14 | 0000 0000 1000 1s |
| 13 | 13 | 0000 0001 0000 S | 47 | 9 | 0010 0111 s |
| 14 | 14 | 0000 0000 1101 0s | 58 | 14 | 0000 0000 1000 0s |
| 15 | 14 | 0000 0000 1100 1s | 59 | 9 | 0010 0011 s |
| 16 | 14 | 0000 0000 1100 0s | 50 | 9 | 0010 0010 s |
| 17 | 14 | 0000 0000 1011 1s | 51 | 9 | 0010 0000 s |
| 18 | 4 | 011s | 52 | 11 | 0000 0011 10s |
| 19 | 7 | 0001 10s | 53 | 11 | 0000 0011 01s |
| 20 | 9 | 0010 0101 s | 54 | 11 | 0000 0011 00s |
| 21 | 11 | 0000 0011 00s | 55 | 13 | 0000 0001 1111 s |
| 22 | 13 | 0000 0001 1011 s | 56 | 13 | 0000 0001 1010 s |
| 23 | 14 | 0000 0000 1011 0s | 67 | 13 | 0000 0001 1001 s |
| 24 | 14 | 0000 0000 1010 1s | 68 | 13 | 0000 0001 0111 s |
| 25 | 5 | 0101 s | 69 | 13 | 0000 0001 0110 s |
| 26 | 8 | 0000 100s | 60 | 14 | 0000 0000 1111 1s |
| 27 | 11 | 0000 0010 11s | 61 | 14 | 0000 0000 1111 0s |
| 28 | 13 | 0000 0001 0100 s | 62 | 14 | 0000 0000 1110 1s |
| 29 | 14 | 0000 0000 1010 0s | 63 | 14 | 0000 0000 1110 0s |
| 30 | 6 | 0011 1s | 64 | 14 | 0000 0000 1101 1s |
| 31 | 9 | 0010 0100 s | 65 | 6 | 0000 01 |
| 32 | 13 | 0000 0001 1100 s |   |   |   |

| | $W_2$ | $W_1$ | $W_0$ | $L_0$ | $BS_1$ | $\Sigma L_0$ MOD 8 | $BS_2$ |
|---|---|---|---|---|---|---|---|
| 1 | XXXXXXXX | XXXXXXXX | 001010XX | 6 | LEFT 6 | 6 | NONE |
| 2 | XXXXXXXX | XX001010 | 0111XXXX | 4 | LEFT 4 | 2 | LEFT 2 |
| 3 | 00101001 | XXXXXX11 | 110XXXXX | 3 | LEFT 3 | 5 | NONE |
| 4 | 00101001 | XXX11110 | 00001100 | 8 | LEFT 8 | 5 | LEFT 3 |
| 5 | 11110000 | XXX01100 | ... | ... | ... | ... | ... |

FIG. 5

| NO. | VACANT LENGTH | PRIME LENGTH | PRIME CODE | NO. | VACANT LENGTH | PRIME LENGTH | PRIME CODE |
|---|---|---|---|---|---|---|---|
| 1 | 0 | 2 | 0 | 34 | 8 | 6 | 0011s |
| 2 | 0 | 2 | s | 35 | 2 | 4 | 10s |
|   |   |   |   | 35 | 6 | 5 | 111s |
| 3 | 0 | 3 | 1s | 36 | 7 | 6 | 0010s |
|   |   |   |   | 37 | 3 | 4 | 11s |
| 4 | 1 | 4 | 00s | 48 | 6 | 5 | 001s |
| 5 | 2 | 4 | 01s | 49 | 3 | 4 | 01s |
| 6 | 4 | 4 | 10s | 40 | 7 | 5 | 1110s |
| 7 | 2 | 7 | 00110s | 41 | 3 | 4 | 00s |
| 8 | 2 | 7 | 00001s | 42 | 7 | 6 | 0101s |
| 9 | 6 | 5 | 010s | 43 | 4 | 4 | 11s |
| 10 | 7 | 6 | 1101s | 44 | 7 | 5 | 0001s |
| 11 | 7 | 5 | 1000s | 45 | 4 | 4 | 01s |
| 12 | 7 | 5 | 0011s | 46 | 8 | 6 | 0001s |
| 13 | 7 | 5 | 0000s | 47 | 2 | 7 | 00111s |
| 14 | 8 | 5 | 1010s | 58 | 8 | 6 | 0000s |
| 15 | 8 | 5 | 1001s | 59 | 2 | 7 | 00011s |
| 16 | 8 | 5 | 1000s | 50 | 2 | 7 | 00010s |
| 17 | 8 | 5 | 0111s | 51 | 2 | 7 | 00000s |
| 18 | 1 | 3 | 1s | 52 | 6 | 5 | 110s |
| 19 | 3 | 4 | 10s | 53 | 6 | 5 | 101s |
| 20 | 2 | 7 | 00101s | 54 | 6 | 5 | 100s |
| 21 | 6 | 5 | 100s | 55 | 7 | 6 | 1111s |
| 22 | 7 | 6 | 1011s | 56 | 7 | 6 | 1010s |
| 23 | 8 | 6 | 0110s | 57 | 7 | 6 | 1001s |
| 24 | 8 | 6 | 0101s | 68 | 7 | 6 | 0111s |
| 25 | 1 | 4 | 01s | 69 | 7 | 6 | 0110s |
| 26 | 4 | 4 | 00s | 60 | 8 | 6 | 1111s |
| 27 | 6 | 5 | 011s | 61 | 8 | 6 | 1110s |
| 28 | 7 | 6 | 0100s | 62 | 8 | 6 | 1101s |
| 29 | 8 | 6 | 0100s | 63 | 8 | 5 | 1100s |
| 30 | 2 | 4 | 11s | 64 | 8 | 5 | 1011s |
| 31 | 2 | 7 | 00100s | 65 | 5 | 1 |   |
| 32 | 7 | 5 | 1100s |   |   |   |   |

VARIABLE LENGTH CODING WITH THREE-FIELD CODES

FIELD OF THE INVENTION

The present invention relates to variable length coding (VLC). Variable length coding is a widely-used method in data compression, especially, in the applications of video data communication and storage. Many international standards have adopted this technique in video data compression, for example, JPEG, MPEG, CCITT H.261 and so on.

Various implementation methods have been proposed for variable length coding. Most of those methods implement the coding with two-field codes. That is, a code is represented by a code word and a code length.

However, in this invention, a three-field representation is used for each variable length code. In comparison with the two-field representation, the three-field representation not only reduces the storage requirements of the code book but also reduces the hardware or cost to implement a variable length encoder. Moreover, the inventive variable length coding technique can be implemented using either a parallel VLC encoder or a serial VLC encoder.

BACKGROUND OF THE INVENTION

In variable length coding, source symbols of a fixed length are encoded with codes of a variable length. Variable length coding is a widely used technique for lossless data compression. VLC has become part of some international standards for various applications, for example, still image coding, video image coding, facsimile coding, and so on.

The variable length coding technique encodes the frequently occurring fixed length source symbols with shorter codes and the infrequently occurring fixed length source symbols with longer codes. Thus, the VLC takes the advantage of a non-uniform distribution in the occurrence of the fixed length source symbols. In general, the length of the code for a fixed length source symbol is designed to be inversely proportional to the probability of the occurrence of the symbol. The most well-known example of a variable length code is the Huffman code.

As the codes are of non-equal length, the encoder should concatenate those codes to form a bit stream without gaps. This may be accomplished using a serial encoder or a parallel encoder. A serial encoder outputs one bit at a time. A parallel encoder outputs a group of bits (e.g., eight) at a time, in parallel. A parallel encoder generally contains circuitry for rearranging the variable length code words into groups of, e.g., eight bits. Conventional VLC techniques are disclosed in M. Stroppiana, L. Ronchetti, Device for reducing the redundancy in blocks of digital video data in DCT encoding U.S. Pat. No. 5006930, 1991.4.9., F. Azadegan, E. Fisch, Method and apparatus for digitally processing a high definition television augmentation signal U.S. Pat. No. 5128758, 1992.7.7., S. M. Lei, M. T. Sun, An Entropy Coding System for Digital HDTV Application, IEEE Trans. on Circuit and system for Video tech., vol. CASV-1, no. 1, pp. 147–155, Feb. 1991, F. Azadegan, Method and apparatus for digitally processing a high definition television augmentation signal, U.S. Pat. No. 5,179,442, 1993.1.12., G. J. Kustka, Variable length decoder, U.S. Pat. No. 5226082, 1993.7.6., K. C. Chu, etc., Variable length decoding using lookup tables, U.S. Pat. No. 5,253,053, 1993.10.12., H. Brusewitz, Method and means for variable length coding, U.S. Pat. No. 492,2510, 1990.5.1., F. Mikami, Variable-length coding/decoding device, U.S. Pat. No. 4,985,700, 1991.1,15., N. Shirota Coding and decoding apparatus of variable length data U.S. Pat. No. 5162795, 1992.11.10., which are incorporated herein by reference.

In most variable length coding systems, the variable length codes are represented by two-field codes. One field stores the code word and the other field records the corresponding code-length. FIG. 1 provides a variable length code for the transform coefficients in CCITT recommendation H.261. There are 127 fixed length source symbols. Each source symbol has two fields designated run and level. The level may be a positive or a negative value. A variable length code is associated with each source symbol. The "s" is "zero" or "one" depending on whether the level is a positive or negative quantity.

FIG. 2 is a table which shows a two-field code associated with each of the fixed length source symbols. One field is the code word length and the other field is the variable length code word itself.

FIG. 3 is a conventional variable length parallel encoder for implementing a codebook using a two-field representation such as shown in FIG. 1 and FIG. 2. The encoder 10 of FIG. 3 comprises two basic sections. The section 12 is a memory or other translation device which receives fixed length source codewords of n bits and outputs the variable length codes in a two field representation. The section 22 concatenates the variable length code words and arranges the variable length code words in groups of, e.g., eight bits for transmission.

In the illustrative encoder 10 of FIG. 3, the translation device 12 is a PLA. The PLA 12 comprises an AND plane 14 which receives the source symbols at the input 15. There are two OR-planes 16 and 18 in the PLA 12. The OR-plane 16 is for outputting the code word and the OR-plane 18 is for outputting the code length. The code word generated by the OR-plane 16 is latched in the register $W_o$. The code length generated by the OR-plane 18 is latched by the register $L_o$.

The output of the encoder is obtained from the register $W_2$ at the output 20. It should be noted that the variable length code words are chosen so that no shorter code comprises a subset of the bits in a longer code. For this reason, a decoder cannot "mistakenly" recognize and decode a shorter code when it is supposed to receive a longer code. Thus, it is not necessary to explicitly transmit the code length information with each variable length code word. Rather, the code length information is used by the circuitry 22 in the encoder 10 to concatenate the variable length code words in groups of bits which are stored in parallel in the register $W_2$.

The circuitry 22 comprises the barrel shifter $BS_1$, the barrel shifter $BS_2$, the code length accumulation circuit 19, and the registers $W_1$ and $W_2$. The code length accumulation circuit accumulates the code lengths latched in the register $L_0$ in each cycle. The barrel shifters $BS_1$ and $BS_2$ operate as follows. In each cycle, the contents of $W_1$ and $W_0$ are concatenated and left shifted in the combined $W_1 W_0$ window by $BS_1$ by a number of spaces determined by $L_0$. The left most eight bits in the $W_1 W_0$ window are then written into $W_1$. The code length accumulation circuit cumulates the contents of $L_0$ over successive cycles by performing a sum of all code lengths stored in $L_0$ ($\Sigma L_0$) modulo W where W is the maximum length of the variable length code word (e.g. eight). The value $\Sigma L_0$ mod W on a cycle i is the occupancy of the register $W_1$ on cycle c+1. In determining $\Sigma L_0$ mod W, the accumulation circuit periodically counts through overflow, i.e., W.

The accumulation circuit 19 outputs an appropriate shift count for the barrel shifter $BS_2$. In the event the accumulation circuit 19 has not counted through overflow, $BS_2$ is not enabled. Instead, the entire new variable length code will be shifted into, and concatenated with, the contents of $W_1$. In the event the accumulation circuit has counted through overflow on a cycle i+1, $BS_2$ is enabled and provided with the shift count 8 minus the value $\Sigma L_0$ modulus 8 determined for the cycle i. As a result, $BS_2$ outputs the W=8 left most bits of the shifted window $W_1 W_0$ for storage in the register $W_2$. The outputted W=8 bits includes the contents of the register $W_1$ on the cycle i followed by at least one bit of the new variable length code in $W_0$ concatenated thereto.

In each cycle where the accumulator circuit cycles through zero, it outputs a control signal to $BS_2$ to control the shift from window $W_1 W_0$ to $W_2$. Thus, this shift will only take place if the window $W_1 W_0$ contains at least W=8 bits.

FIG. 4 is a table which shows the values of $W_0$, $W_1$, $W_2$, $L_0$, and $\Sigma L_0$ mod W in an example where W=8 for each of five cycles.

The example encoder shown in FIG. 3 is a conventional parallel encoder. The encoder complexity will depend on the code book. Let the code book length be N and the longest code-length be W. The bit number to represent the code-length will be $\lceil l=\log_2 W \rceil$ where $\lceil x \rceil$ ceiling or least integer less than or equal to x. Let the fixed length source symbol input to the PLA 12 be n bits. We can estimate the gate count required by the components in the encoder of FIG. 3 roughly as follows.

PLA: (n+W+l) N×1 gates registers: (3W+l)×8 gates barrel shifters: {2[W+2W]W/2+2Wl}×1 gates accumulator: l×8+l×9 gates Totally, the number of gates required by this conventional encoder (which uses a two-field representation for each variable length codeword) is approximately $$T_0=(n+W+l)N+25l+24W+3W^2+2lW.$$

Therefore, the system complexity (or cost) is approximately proportional to the square of W. As the longest code length increases, the complexity of the encoder will increase. Consider the case where W=14, N=127, n=9, and l=4. In this case $T_0$=4565.

In view of the foregoing, it is an object of the invention to provide a VLC encoding technique which utilizes an encoder of reduced complexity.

It is also an object of the invention to provide a VLC encoding technique which reduces the storage requirements of a VLC code book.

SUMMARY OF THE INVENTION

This and other objects are achieved by the present invention. An examination of each variable length code in a typical code book or variable length code table reveals that each variable length code can be divided into three constituent fields. In particular, each variable length code word can be divided into a vacant code, followed by a separator bit and a prime code. The vacant code is a variable length sequence of bits which are all the same logic bit value, i.e., all logic '1' or all logic '0'. The prime code is also a variable length sequence of bits. However, the logic bit values of the prime code can vary. The separator bit is the opposite logic bit value as is contained in the vacant code.

Such a decomposition of the variable length codes into three fields allows for compaction of the variable length code book or table.

According to one embodiment of the invention, a method for variable length encoding a fixed length code word comprises the step of converting a fixed length source symbol into a prime code, a prime code length and a vacant code length. For instance, the fixed length source symbol can be received at a PLA which is programmed to produce a unique combination of prime code, prime code length and vacant code length for each possible fixed length source symbol. The prime code, prime code length and vacant code length are then converted to a variable length code. For instance, in a given variable length code book or table, the logic bit value used to form the vacant code is predetermined. A vacant code can thus easily be generated from the vacant code length. The vacant code is concatenated to an appropriate logic bit value separator bit and then to the prime code to produce the variable length code.

The foregoing may be accomplished in a serial encoder or a parallel encoder.

BRIEF DESCRIPTION OF THE DRAWINGS

FIG. 1 is table which associates a variable length code word with each of a plurality of fixed length source symbols.

FIG. 2 is a table which associates a two field representation of a variable length code with each of a plurality of fixed length source symbols.

FIG. 5 is a table which associates a three field representation of a variable length code with each of a plurality of fixed length source symbols, according to an embodiment of the invention.

DETAILED DESCRIPTION OF THE INVENTION

In order to understand the invention, it is useful to consider how three fields may be used to represent each VLC code word. FIG. 5 is a table which implements the variable length code of FIG. 2 but using a three-field, rather than a two-field, representation. The variable length code words of FIG. 5 require a maximum of only 12 bits when the three field representation is used. This contrast with a maximum of 18 bits for the two field representation of FIG. 2.

To explain the three fields representation, it is useful to define the terms prime code and vacant code. A variable length code usually has a string of leading zeros (or leading ones). The leading part can be called vacant code. Following the vacant code, the first bit (which can be referred to as a separator bit) must be the opposite logic bit value as the vacant code. That is, if the vacant code is a string of leading zeros, the separator bit is one and if the vacant code is a string of leading ones, the separator bit is zero. Following the separator bit, there is part of a code called prime code. These are illustrated as follows:

| Vacant Code | Separator bit | Prime Code |
| --- | --- | --- |
| 00000 ... 00 | 1 | xxxxxx |

Some code sets may begin with a string of leading ones. They can also be partitioned into vacant code and prime code separated by a separator bit. (The separator bit always has the opposite polarity of the bits in the vacant code). For example:

| Vacant Code | Separator bit | Prime Code |
| --- | --- | --- |
| 11111 ... 11 | 0 | xxxxxx |

Taking this into account, it is noted that according to the invention, a variable length code can be represented by a triplet of prime code, prime code length (including one bit position for the separator bit) and a vacant code length, instead of a pair of codeword and code length. With this three-field representation, the storage requirements of a code book can be reduced; also the encoder can be reduced in complexity.

Figure 6:
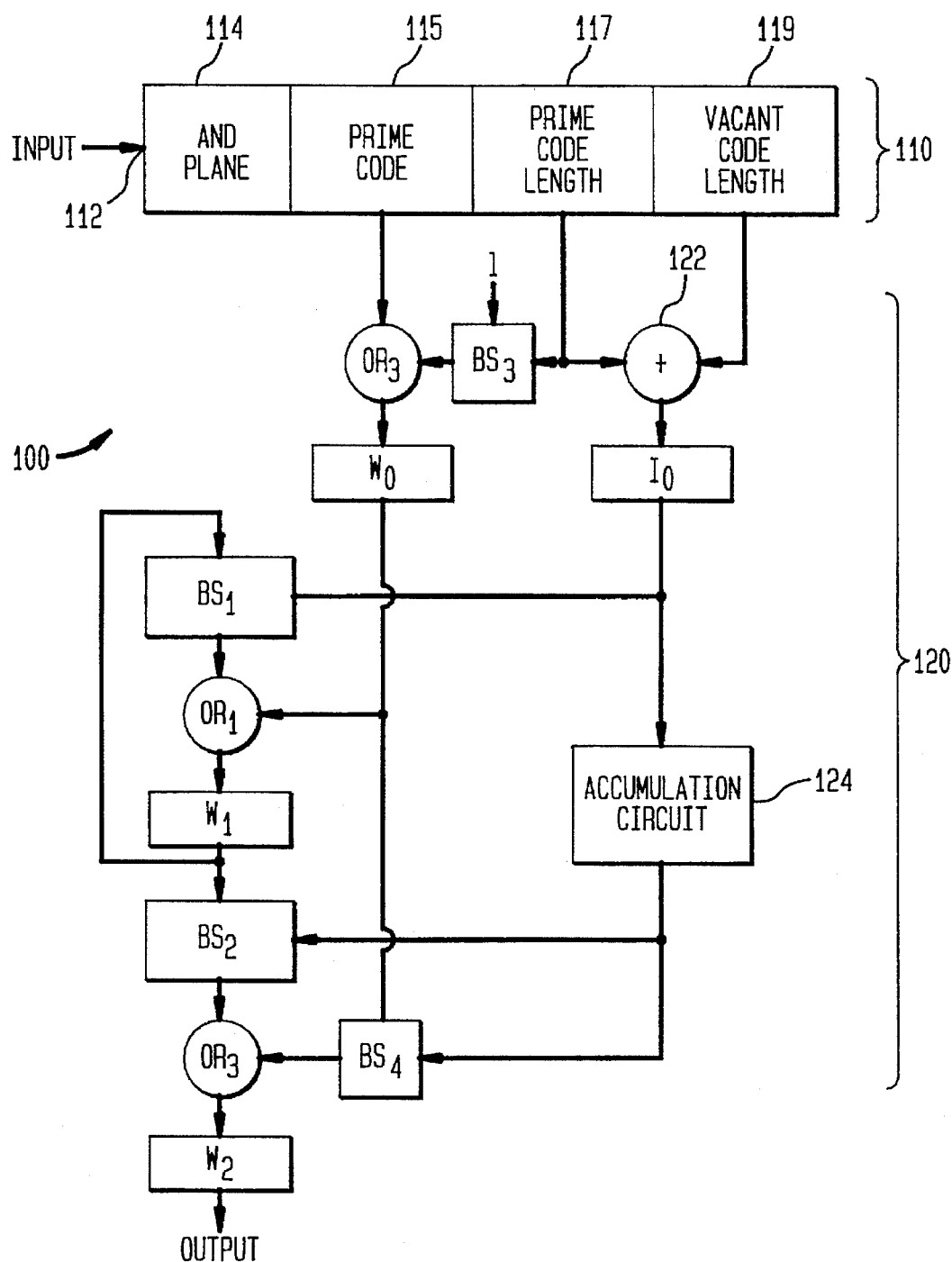
FIG. 6 is a parallel variable length encoder which implements a variable length code table using a three field representation for each variable length code, according to an embodiment of the invention.

FIG. 6 schematically illustrates a variable length encoder 100 which utilizes the three field representation for variable length coder. The variable length encoder 100 comprises a first section 110 which comprises a translation circuit which receives fixed length source symbols at an input 112 and outputs variable length codes in a three-field representation.

Specifically, the translation circuit 110 comprises a PLA having an AND-plane 114 and three OR-planes 115, 117, 119 which output the three field representation of each variable length code. The OR-plane 115 outputs a prime code. The OR-plane 117 outputs a prime code length. The OR-plane 119 outputs a vacant code length.

The encoder 100 also comprises a second section 120. The circuitry of section 120 converts the three-field representations of variable length code words into the variable length codewords themselves and concatenates the variable length codewords. The circuitry 120 operates as follows.

Suppose a fixed length source symbol arrives at input 112, which fixed length source symbol has the variable length code '00011101', including a three bit vacant code '000', a separator bit of '1' and a four bit prime code '1101'. Furthermore, suppose the value '101111' is currently stored in the register $W_1$.

First, the fixed length source symbol causes the PLA 110 to output the vacant code length of 3, the prime code length of 5 and the prime code of '1101'. (The prime code length is the length of the prime code and separator bit). The vacant code length and prime code length are added together in the adder circuit 122 to produce the total length 8 which is stored in register $L_0$. Meanwhile, the prime code length is inputted to a barrel shifter $BS_3$ which shifts a separator bit, in this case logic '1', five bit positions to the left. The barrel shifter $BS_3$ is controlled to mask out each other bit of the input thereby producing a byte containing zero valued bits, except for the bit position designated by the prime code length, in this case, the $5^{th}$ bit position from the right, which contains the separator bit. The barrel shifter $BS_3$ therefore outputs the value '00010000'. The value '00010000' outputted by the barrel shifter $BS_3$ is logically OR'ed with the prime code outputted from the PLA in the OR circuit $OR_3$ to produce the value '00011101'. This value '00011101' is stored in the register $W_0$.

In this manner the separator bit is appended to the prime code.

The value 'xx101111' (where "x" indicates "don't care" bits) stored in the register $W_1$ is outputted to a barrel shifter $BS_1$ as an eight bit window of the barrel shifter $BS_1$. The barrel shifter $BS_1$ receives the length stored in the register $L_0$ as a shift count, in this case, 8. The barrel shifter $BS_1$ is operated to left shift its input a number of bit positions as designated by the shift count inputted thereto and to output the eight rightmost bits of the shifted result. When left shifting, the logic bit value '0' is inserted into the vacated right most bit positions. Therefore, the window 'xx101111' is left shifted 8 bit positions to produce 'xx101111 00000000', of which '00000000' is outputted from the barrel shifter $BS_1$.

The value '00000000' outputted from the barrel shifter $BS_1$ is inputted to OR gate $OR_1$ which also receives the value '00011101' stored in $W_0$ as an input. The OR gate $OR_1$ logically OR's these two values '00000000' and '00011101' to produce the value '00011101' which is stored in the register $W_1$, thereby overwriting the contents previously stored therein. As will be discussed in greater detail below, the first two bits of the value '00011101' are simultaneously concatenated with the former contents of the register $W_1$ for shifting out. Thus, there may be overlapping bits that are stored in both the registers $W_1$ and $W_2$. For purposes of clarity, the overlapping bits in register $W_1$ are treated as "don't care" bits since they will be discarded. Thus, as a matter of notation, the register $W_1$ is said to store the value 'xx011101'.

Meanwhile, the code length 8 stored in register $L_0$ is also outputted to an accumulation circuit 124. The accumulation circuit 124 determines a total modulo 8 sum of the lengths of all variable length codes produced in the inventive circuit, i.e., $\Sigma\ L_0$ modulo W=8. For instance, assume that the previously determined variable length code had a length of 6. Therefore, the total modulo 8 length is 6 (8+6 mod 8=6). The modulo 8 count indicates two things:

(1) whether or not the concatenation of the current variable length code to the contents of the register $W_1$ comprises at least W=8 bits (which W=8 bits can be transferred into the register $W_2$), and (2) during the cycle i, the occupancy of the register $W_1$ for the next cycle i+1.

In this case, six bits were previously stored in the register $W_1$ and another eight bit variable length code was produced. Since the variable length codes are concatenated and outputted in eight bit units, eight of the fourteen bits will be outputted and six bits will remain in the register $W_1$. As discussed in greater detail below, the eight bits to be outputted will include the six bits '101111' previously stored in the register $W_1$ concatenated to the first two bits '00' of the current variable length code '000111101' most recently formed.

The accumulation circuit determines that there are at least W=8 bits available for output whenever the modulo eight accumulation circuit counts through overflow (i.e., W). In such a case, the accumulation circuit outputs a control signal for enabling the barrel shifters $BS_2$ and $BS_4$.

Furthermore, the accumulation circuit 124 outputs an appropriate shift count for the barrel shifters $BS_2$ and $BS_4$. In the event the accumulation circuit has not counted through overflow, $BS_2$ and $BS_4$ are not enabled. However, in the event the accumulation circuit has counted through overflow in a cycle i+1, the shift count is the difference of 8 minus $\Sigma\ L_0$ modulo 8 for cycle i.

Note that this manner of operation reflects the sum of the occupancy of the register $W_1$ plus the length of the current variable length code. $\Sigma L_0$ modulo W on a cycle i is the occupancy of $W_1$ on cycle i+1. If in determining $\Sigma L_0$ modulo W on cycle i+1, the accumulation circuit does not count through overflow, then the concatenation of the current variable length code to the contents of $W_1$ is less than W=8 bits long. If in determining $\Sigma L_0$ modulo W on cycle i+1, the accumulation circuit counts through overflow, then the concatenation of the current variable length code to the contents of $W_1$ contains at least W=8 bits. Therefore, by enabling $BS_2$ and $BS_4$, the W=8 bits including the contents of $W_1$ followed by at least some of the bits of the current variable length code concatenated thereto are transferred to the register $W_2$. (The remaining bits of the current variable length code not transferred are stored in $W_1$ by $BS_1$ and $OR_1$) However, in order to shift the window $W_1 W_0$ to output W=8 bits, the window $W_1 W_0$ must be shifted by a number of bits equal to W less the occupancy of $W_1$ on cycle i or 8-$\Sigma L_0$ modulo 8 for cycle i.

In this case, the accumulation circuit counts through overflow so the bits 'xx101111' in $W_1$ will be concatenated with at least some of the bits of the recently generated variable length code '00011101'. In particular, the accumulation circuit indicates that the occupancy of $W_1$ on the previous cycle i was 6. Therefore, 8-6 or 2 bits must be concatenated with the value 'xx101111' prior to transfer to the register $W_2$. The accumulation circuit therefore outputs 2 to the barrel shifters $BS_2$ and $BS_4$.

The barrel shifter $BS_2$ receives the value 'xx101111' outputted from the register $W_1$. The barrel shifter $BS_2$ left shifts the received byte a number of bit positions as indicated by the shift count received from the accumulation circuit, i.e., 2, and outputs the shifted byte of the shifted window. $BS_2$ shifts in zeros into the vacated right most bit positions. Thus, the barrel shifter $BS_2$ outputs the value '10111100'.

The barrel shifter $BS_4$ receives a sixteen bit window comprising '00000000' as the left most byte and the variable length code '00011101' as the right most byte. The barrel shifter $BS_4$ left shifts the window a number of bit positions as indicated by the shift count received from the accumulation circuit, i.e., 2, and outputs the leftmost byte of the shifted window. Thus, the barrel shifter $BS_4$ outputs the value '00000000' comprising the six least significant bits '000000' of the leftmost byte '00000000' of the window and the two most significant bits '00' of the rightmost byte '00011101' of the window.

The values produced by the barrel shifter $BS_4$, i.e., '00000000' and the barrel shifter $BS_2$, i.e., '10111100' are inputted to OR gate $OR_2$ where they are logically OR'ed. This produces the result '10111100' comprising the six bits of the register $W_1$ and the first two bits of the variable length code '00011101'. This produced value '10111100' is then stored in the register $W_2$ and the prior contents of the register $W_2$ are outputted.

Note that part of the variable length code 00011101 which is produced (namely, the two most significant bits '00') is immediately concatenated with previous data stored in the register $W_1$ for output via the register $W_2$. Thus, there is an overlap in the register $W_1$ of the two most significant bits which have already been outputted. However, these bits are discarded in the next shift operation and can be treated as "don't care" bits as indicated above.

Figures 3, 4:
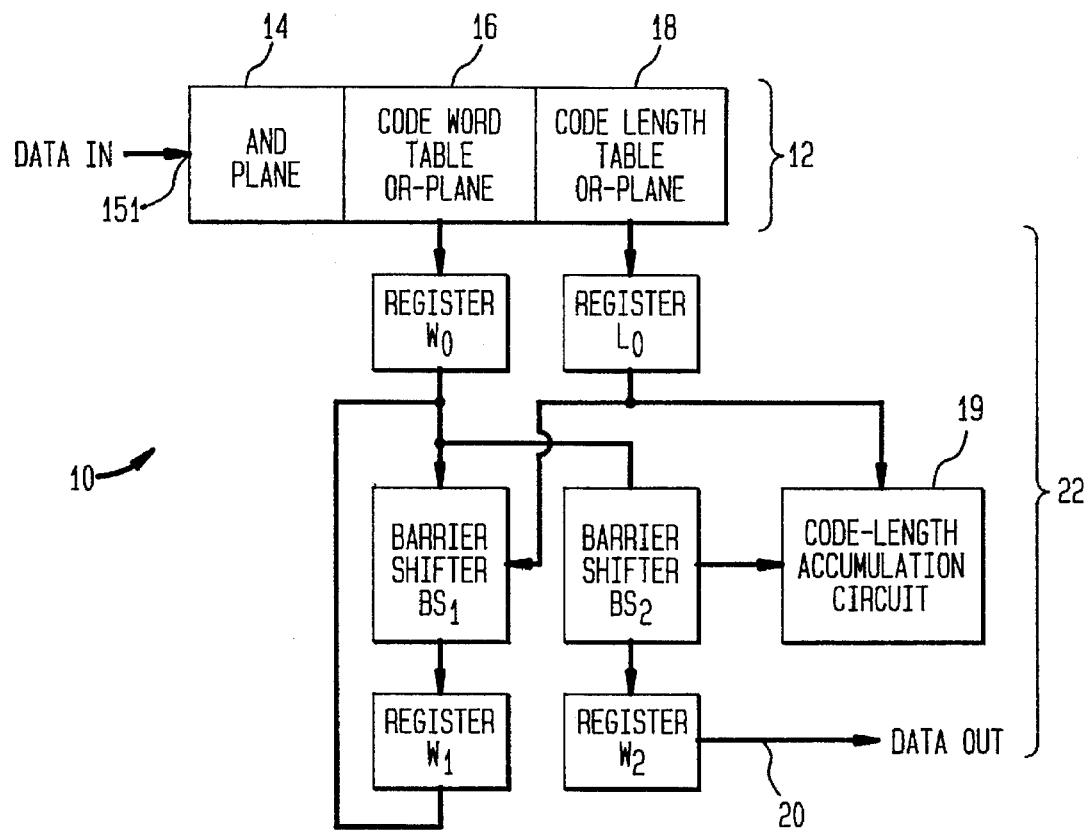
FIG. 3 is a conventional parallel encoder which implements a variable length code table using a two field representation for each variable length code.
FIG. 4 is a table which illustrates the operation of the encoder of FIG. 3.

The complexity of the inventive encoder 100 of FIG. 6 may be determined and compared with the complexity of the conventional encoder of FIG. 3. Let the length of the considered code book be N and its longest code length be W.

If the maximum prime code length is $W_p$, the bit number to represent the prime code length will be $l_p = \lceil \log_2 W_p \rceil$. Also, let the vacant code length be represented by $l_v$ bits and the data input to PLA be n bits. We can estimate that gate count required by those components roughly as follows.

PLA: $(n+W_p+l_p+l_v)$ N×1 gates
registers: $(2W+W_p+1)$×8 gates
barrel shifters: $(2W(W-1)+2(W-1)+Wp^2+Wp^2/2+2W_pl_l)$ ×1 gates
accumulator: 1×8+1×9 gates
adder: max $(l_p, l_v)$×9 gates
OR gates: 3 $(W_p+1)$×1 gates Totally, the number of gates required for the improved system is approximately $$T_1 = (n+W_p+l_p+l_v)N+23l+11W_p+14W+2W^2+1.5W_p{}^2+2lW+2W_pl_p+\max(9l_p, 9l_v)+3.$$

Then, the comparison of the complexity of the conventional approach and the improved approach can be expressed by $$T_0-T_1=(W+l-W_p-l_p-l_v)N+(10W+2l-11W_p)+(W^2-1.5W^2{}_p)-2W_pl_p\max(9lp, 9lv)-3$$

In most of the cases, the $W_p+l_p+l_v$ will be less than W+l. Also, $W_p{}^2$ is much less than $W^2$. Therefore, in most of the cases, the invention method will be more cost-effective than the conventional method.

Consider the code book shown in FIG. 5 as an example. These parameters will be as follows.

W=14
N=127
n=9
l=4
$W_p$=6
$l_p$=3
$l_0$=4
Then,
$T_0$=4565
and
$T_1$=3603

It can be seen that about 25% of the gate count can be saved.

In short, a new variable length coding technique is disclosed. Each code word is represented by three fields rather than the conventional two fields. As shown above, the inventive method can reduce the implementation cost of a parallel variable length encoder. The example given above shows that the invention can save 25% of the encoder circuit. However, the percentage is dependent on the code book. When the code book is large, the percentage will become more significant than for that of small code book. The inventive technique is applicable to a variety of video encoding standards. The storage requirements for the codebook are reduced. Moreover, the inventive technique can be implemented in serial as well as parallel encoders.

Finally, the above-described embodiments of the invention are intended to be illustrative only. Numerous alternative embodiments may be devised by those skilled in the art without departing from the scope of the following claims.

I claim:

1. A method for encoding a sequence of fixed length source symbols comprising:

a) in an encoder, converting a fixed length source symbol into a prime code, a prime code length and a vacant code length, using a code table which assigns a predetermined prime code, prime code length and vacant code length to each distinct fixed length source symbol, and b) in said encoder, converting said prime code, said prime code length and said vacant code length into a predetermined variable length code.

2. The method of claim 1 wherein said step (b) further comprises:

concatenating said prime code to a vacant code, wherein said vacant code comprises a sequence of identical logic bit values, and wherein said vacant code has a length equal to said vacant code length.

3. The method of claim 2 wherein said step of concatenating further comprises concatenating a logic bit of opposite logic bit value to said identical logic bit values of said vacant code between said prime code and said vacant code.

4. A method of generating a sequence of variable length codes in an encoder comprising:

a) receiving a sequence of fixed length source symbols at an encoder, b) translating a fixed length source symbol into a prime code, a prime code length indicating a length of said prime code, and a vacant code length, using a code table which assigns a predetermined prime code, prime code length and vacant code length to each distinct fixed length source symbol, and c) generating a variable length code comprising said prime code and a vacant code, said vacant code having a length equal to said vacant code length.

5. A method for generating a variable length code from a fixed length source symbol comprising the steps of:

applying said fixed length source symbol to a translator device for generating a prime code, a prime code length, and a vacant code length, using a code table which assigns a predetermined prime code, prime code length and vacant code length to each distinct fixed length source symbol, and using a concatenating circuit, concatenating said prime code to a vacant code having a length given by said vacant code length and comprising bits of a first logic value, said prime code being separated from said vacant code by a bit of a second logic value.

6. A variable length encoder circuit comprising:

a) a translator circuit for translating a fixed length source symbol into a triplet comprising a prime code, a prime code length and a vacant code length, using a code table which assigns a predetermined prime code, prime code length and vacant code length to each distinct fixed length source symbol, and b) a concatenation circuit for converting said triplet into a variable length code which is concatenated with previously generated variable length codes.

7. The variable length encoder circuit of claim 6 wherein said concatenation circuit further comprises:

a first circuit including a first barrel shifter and first OR gate for appending said prime code and a separator bit to previously generated variable length codes.

* * * * *